United States Patent
Glenn et al.

(10) Patent No.: US 6,620,646 B1
(45) Date of Patent: Sep. 16, 2003

(54) CHIP SIZE IMAGE SENSOR WIREBOND PACKAGE FABRICATION METHOD

(75) Inventors: Thomas P. Glenn, Gilbert, AZ (US); Steven Webster, Chandler, AZ (US); Markus K. Liebhard, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 228 days.

(21) Appl. No.: 09/712,314

(22) Filed: Nov. 13, 2000

(51) Int. Cl.⁷ ............................................... H01L 21/48
(52) U.S. Cl. .................. 438/107; 438/110; 438/112; 438/113; 438/126; 438/456; 438/458; 438/460
(58) Field of Search .............................. 438/48, 57, 73, 438/75, 64, 65, 69, 106, 107, 109, 110, 112, 113, 116, 124, 127, 142, 144, 612, 613, 617, 455, 456, 459, 460; 257/183, 183.1, 213, 215, 222, 225, 44, 428, 431, 432, 433, 434, 290, 291, 81–84, 79, 80, 459, 678, 680, 681, 684, 687, 787, 723, 724

(56) References Cited

U.S. PATENT DOCUMENTS

| | | | |
|---|---|---|---|
| 4,760,440 A | * 7/1988 | Bigler et al. ............... 257/680 |
| 4,801,998 A | 1/1989 | Okuaki ....................... 257/681 |
| 5,138,145 A | * 8/1992 | Nakamura et al. .......... 438/118 |
| 5,194,934 A | 3/1993 | Yamazaki et al. .......... 257/782 |
| 5,331,203 A | * 7/1994 | Wojnarowski et al. ...... 257/698 |
| 5,343,074 A | 8/1994 | Higgins, III et al. ........ 257/668 |
| 5,352,852 A | * 10/1994 | Chun ......................... 257/680 |
| 5,821,532 A | 10/1998 | Beaman et al. ............. 250/239 |
| 5,867,368 A | 2/1999 | Glenn ......................... 361/783 |
| 5,962,810 A | 10/1999 | Glenn ........................ 174/52.2 |
| 6,037,641 A | 3/2000 | Goel .......................... 257/432 |
| 6,130,448 A | 10/2000 | Bauer et al. ................ 257/222 |
| 6,143,588 A | 11/2000 | Glenn ......................... 438/116 |
| 6,144,107 A | 11/2000 | Narita ........................ 257/789 |
| 6,144,507 A | 11/2000 | Hashimoto ................. 359/819 |
| 6,147,389 A | 11/2000 | Stern et al. ................. 257/434 |
| 6,255,741 B1 | * 7/2001 | Yoshihara et al. .......... 257/792 |
| 6,266,197 B1 | * 7/2001 | Glenn et al. ................ 359/819 |
| 6,281,568 B1 | 8/2001 | Glenn et al. ................ 257/684 |
| 6,335,224 B1 | * 1/2002 | Peterson et al. ............ 438/114 |
| 6,342,406 B1 | * 1/2002 | Glenn et al. ................... 438/57 |
| 6,396,043 B1 | * 5/2002 | Glenn et al. ................ 257/431 |
| 6,407,381 B1 | * 6/2002 | Glenn et al. ................ 257/433 |
| 6,441,478 B2 | * 8/2002 | Park .......................... 257/698 |
| 6,455,927 B1 | * 9/2002 | Glenn et al. ................ 257/686 |
| 6,509,560 B1 | 1/2003 | Glenn et al. ................ 250/239 |
| 6,512,219 B1 | 1/2003 | Webster et al. ........... 250/208.1 |
| 6,515,269 B1 | 2/2003 | Webster et al. ........... 250/208.1 |

FOREIGN PATENT DOCUMENTS

| | | | |
|---|---|---|---|
| JP | 02278872 A | 11/1990 | ........... H01L/27/14 |
| JP | 02278872 | 11/1990 | ................. 257/433 |
| JP | 03209746 | 9/1991 | ................. 257/434 |
| JP | 10223790 | 8/1998 | |
| JP | 10223790 A | 8/1998 | ........... H01L/23/08 |

* cited by examiner

*Primary Examiner*—Alonzo Chambliss
(74) *Attorney, Agent, or Firm*—Gunnison, McKay & Hodgson, L.L.P.; Serge J. Hodgson

(57) ABSTRACT

To form an image sensor package, a window is mounted above an active area on an upper surface of an image sensor. A noncritical region of the upper surface of the image sensor is between the active area and bond pads of the image sensor. A lower surface of a step up ring is mounted above the noncritical region of the upper surface of the image sensor. An upper surface of the step up ring includes a plurality of electrically conductive traces. Bond wires are formed between the bond pads of the image sensor and the electrically conductive traces on the upper surface of the step up ring. The step up ring is mounted so that the window is located in or adjacent a central aperture of the step up ring.

27 Claims, 8 Drawing Sheets

CHIP SIZE IMAGE SENSOR WIREBOND PACKAGE FABRICATION METHOD

BACKGROUND OF THE INVENTION

1. Field of the Invention

The present invention relates generally to the packaging of electronic components. More particularly, the present invention relates to a method of forming an image sensor package.

2. Description of the Related Art

Image sensors are well known to those of skill in the art. An image sensor included an active area, which was responsive to electromagnetic radiation. To avoid obstructing or distorting the electromagnetic radiation which struck the active area of the image sensor, it was important to avoid contamination, e.g., from dust, of the active area.

Image sensors were fabricated from a silicon wafer. More particularly, a plurality of image sensors were formed in a single silicon wafer. The silicon wafer was singulated, sometimes called cut-up or diced, to separate the image sensors from one another. However, during this wafer singulation, silicon shards were generated. These silicon shards had a tendency to contaminate and scratch the active areas of the image sensors. As a result, image sensors were damaged or destroyed, which undesirably decreased the yield. However, to reduce cost, it is important to have a high yield.

The singulated image sensor was then used to fabricate an image sensor assembly. In this assembly, the image sensor was located within a housing, which supported a window. Radiation passed through the window and struck the active area of the image sensor, which responded to the radiation.

In one prior art assembly, an image sensor was mounted to a printed circuit mother board. After the image sensor was mounted, a housing was mounted around the image sensor and to the print circuit mother board. This housing provided a hermetic like seal around the image sensor, while at the same time, supported a window above the image sensor.

As the art moves to smaller and lighter weight electronic devices, it becomes increasingly important that the size of the image sensor assembly used within these electronic devices is small. Disadvantageously, the conventional image sensor assembly described above required a housing to support the window and to hermetically seal the image sensor. However, this housing was relatively bulky and extended upwards from the printed circuit mother board a significant distance, e.g., 0.100 inches (2.54 mm) to 0.120 inches (3.05 mm) or more. As a result, the image sensor assembly was relatively large.

In the event that moisture was trapped inside of the housing, defective operation or failure of the image sensor assembly was observed. More particularly, the moisture had a tendency to condense within the housing and on the interior surface of the window. Even if the housing later dried out, a stain was left on the window. In either event, electromagnetic radiation passing through the window was distorted or obstructed by either moisture condensation or stain, which resulted in defective operation or failure of the image sensor assembly.

For this reason, an important characteristic was the temperature at which condensation formed within the housing of the image sensor assembly, i.e., the dew point of the image sensor assembly. In particular, it was important to have a low dew point to insure satisfactory performance of the image sensor assembly over a broad range of temperatures.

SUMMARY OF THE INVENTION

In accordance with the present invention, an image sensor assembly, sometimes called an image sensor package, includes an image sensor having an upper surface. The image sensor further includes an active area and bond pads on the upper surface. The upper surface includes a noncritical region between the active area and the bond pads. A step up ring is mounted above the noncritical region. Electrically conductive traces on the step up ring are electrically connected to the bond pads by bond wires.

In one embodiment, a window is supported above the active area by a window support. The step up ring has a central aperture and is mounted around the window such that the window is located in or adjacent the central aperture. An inner package body, e.g., formed of an encapsulant, fills the central aperture and encloses sides of the window, thus mechanically locking the window in place.

The image sensor assembly further includes an outer package body, e.g., formed of an encapsulant. The outer package body encloses the bond pads and the bond wires. The outer package body has outer sides coplanar with sides of the image sensor. Advantageously, the image sensor assembly is the size of the image sensor, i.e., the image sensor assembly is chip size. Since the image sensor assembly is chip size, the image sensor assembly is extremely well suited for use with miniature lightweight electronic devices, which require small and lightweight image sensor assemblies.

In accordance with an alternative embodiment, an image sensor assembly includes an image sensor having an upper surface. The image sensor includes an active area and a bond pad on the upper surface of the image sensor. A step up ring includes an electrically conductive interior trace on a lower surface of the step up ring. The step up ring is mounted to the image sensor by an electrically conductive bump between the bond pad and the interior trace, i.e., the step up ring is flip chip mounted to the image sensor.

Also in accordance with present invention, a method includes mounting a window above an active area on an upper surface of an image sensor. A bond pad is on the upper surface of the image sensor and a noncritical region of the upper surface of the image sensor is between the bond pad and the active area. The method further includes mounting a step up ring above the noncritical region. A trace on the step up ring is electrically connected to the bond pad, for example, with a bond wire.

In one embodiment, the step up ring includes a central aperture and is mounted around the window such that the window is located in or adjacent to the central aperture. The central aperture is filled with an encapsulant to form an inner package body. An outer package body is formed to enclose the bond wire between the trace and the bond pad.

In another embodiment, a method includes mounting a window above an active area on an upper surface of an image sensor, the image sensor comprising a bond pad on the upper surface. An interior trace on a lower surface of a step up ring is aligned with the bond pad. A bump is formed between the interior trace and the bond pad to mount the step up ring to the image sensor.

In yet another alternative embodiment, windows are mounted above active areas on upper surfaces of image sensors integrally connected together as part of an image sensor substrate. A sheet includes step up rings integrally connected together. The sheet is aligned with an image sensor substrate. The sheet is mounted to the image sensor substrate by bumps, wherein the windows are located in or adjacent central apertures of the step up rings.

These and other features and advantages of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
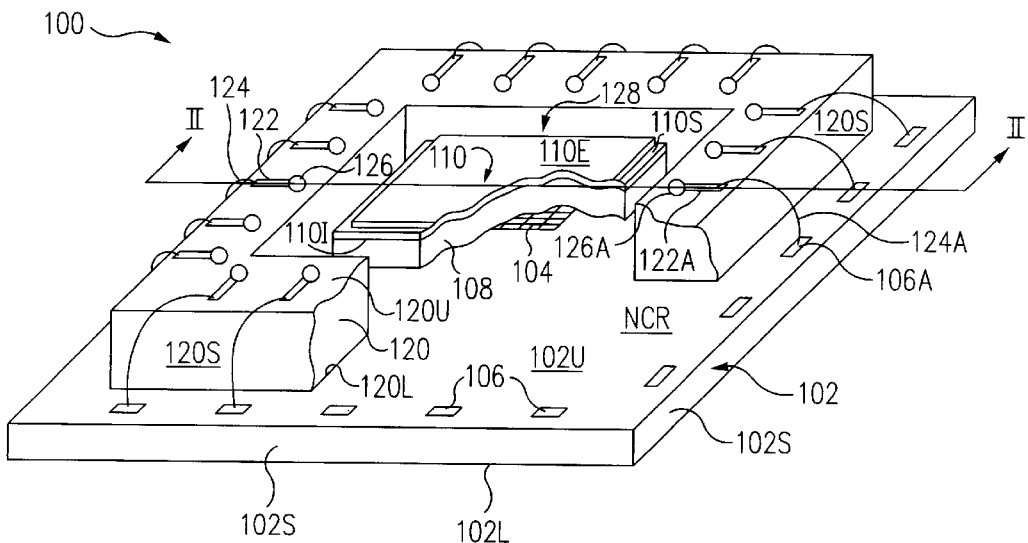
FIG. 1 is a partial perspective view, partially cutaway, of an image sensor assembly in accordance with the present invention.

An image sensor assembly 100 (FIGS. 1, 2), sometimes called an image sensor package, includes an image sensor 102 having an upper surface 102U. Image sensor 102 further includes an active area 104 and bond pads 106 on upper surface 102U. A window 110 is supported above active area 104 by a window support 108. A step up ring 120 is mounted above a noncritical region NCR of upper surface 102U of image sensor 102 between active area 104 and bond pads 106. Electrically conductive traces 122 on step up ring 120 are electrically connected to bond pads 106 by bond wires 124. Advantageously, use of step up ring 120 allows interconnection balls 126 formed on traces 122 to have minimum size and pitch. This may be important, for example, when a large number of interconnection balls 126 must be provided in a limited area.

An inner package body 140 (FIG. 2) is formed between step up ring 120 and window support 108 and mechanically locks window 110 in place. An outer package body 150 is formed to enclose bond wires 124, bond pads 106, and outer sides 120S of step up ring 120. Advantageously, image sensor assembly 100 is chip size and is extremely well-suited for use with miniature lightweight electronic devices, which require small and lightweight image sensor assemblies.

Figure 2:
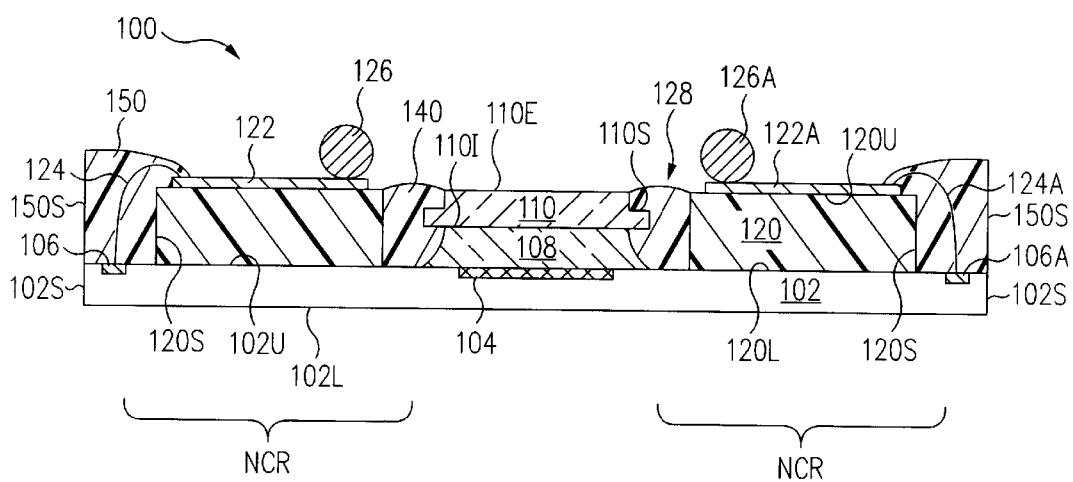
FIG. 2 is a cross-sectional view of the assembly along the line II—II of FIG. 1.

More particularly, FIG. 1 is a partial perspective view, partially cutaway, of an image sensor assembly 100 (hereinafter assembly 100) in accordance with the present invention. FIG. 2 is a cross-sectional view of assembly 100 along the line II—II of FIG. 1. Assembly 100 is sometimes referred to as an image sensor package.

Referring to FIGS. 1 and 2 together, assembly 100 includes an image sensor 102, sometimes called a sensor device. Image sensor 102 includes an active area 104, sometimes called an image array. Active area 104 is on an upper, e.g., first, surface 102U of image sensor 102. Image sensor 102 further includes a lower, e.g., second, surface 102L, opposite upper surface 102U, and sides 102S extending between upper surface 102U and lower surface 102L.

Generally, active area 104 is responsive to radiation, e.g., electromagnetic radiation, as is well known to those of skill in the art. For example, active area 104 is responsive to infrared radiation, ultraviolet light, and/or visible light. Illustratively, image sensor 102 is a CMOS image sensor device, a charge coupled device (CCD), a pyroelectric ceramic on CMOS device, or an erasable programmable read-only memory device (EPROM) although other image sensors are used in other embodiments.

Image sensor 102 further includes a plurality of bond pads 106 on upper surface 102U of image sensor 102. Bond pads 106 are connected to the internal circuitry of image sensor 102. Further, active area 104 is located inwards of bond pads 106.

Formed on active area 104 is a window support 108. More particularly, window support 108 contacts and entirely encloses active area 104 yet does not extend over bond pads 106. Generally, window support 108 is transparent to the radiation of interest, e.g., to the radiation to which active area 104 of image sensor 102 is responsive, as those of skill in the art will understand. In one particular embodiment, window support 108 is MasterSil product grade 151 silicone epoxy available from Masterbond Inc. located in Hackensack, N.J.

Window support 108 is in contact with and secures a window 110 to upper surface 102U of image sensor 102. Window support 108 supports window 110 above active area 104. Window 110 includes an interior, e.g., first, surface 110I and an exterior, e.g., second, surface 110E opposite interior surface 110I. Interior surface 110I is secured to window support 108 and exterior surface 110E is exposed to the ambient environment. Window 110 further includes sides 110S, which extend between exterior surface 110E and interior surface 110I.

In this embodiment, window support 108 contacts interior surface 110I only, or a central portion of interior surface 110I only, i.e., does not contact sides 110S. Further, window 110 overlies active area 104 and does not overlie bond pads 106.

Window 110 is parallel to upper surface 102U of image sensor 102. More particularly, a plane defined by interior surface 110I (or exterior surface 110E) is parallel to a plane defined by upper surface 102U of image sensor 102.

Window 110 is transparent to the radiation of interest, e.g., to the radiation to which active area 104 of image sensor 102 is responsive, as those of skill in the art will understand. In one particular embodiment, window 110 is optically transparent borosilicate glass.

Generally, the transmittance of window support 108 and window 110 is sufficient to allow the necessary minimum amount of radiation needed for the proper operation of image sensor 102 to pass through window support 108 and window 110.

During use, radiation is directed at assembly 100. This radiation passes through window 110, through window support 108 and strikes active area 104, which responds to the radiation as is well known to those of skill in the art. However, in an alternative embodiment, active area 104 of image sensor 102 transmits radiation such as electromagnetic radiation. For example, image sensor 102 is a light emitting diode (LED) micro-display. In accordance with this embodiment, radiation transmitted by active area 104 passes through window support 108, through window 110, and emanates from assembly 100. For simplicity, in the above and following discussions, active area 104 as a receiver of radiation is set forth. However, in light of this disclosure, those of skill in the art will recognize that generally active area 104 can be a receiver of radiation, a transmitter of radiation, or a transceiver, i.e., a transmitter and a receiver, of radiation. Further, in the embodiments illustrated in FIGS. 4, 5 and 6, instead of being an image sensor, sensor device 102 is a micromachine chip and active area 104 is a micromachine area containing a micromachine element.

In one embodiment, the refractive index of window support 108 is similar to the refractive index of window 110. In this manner, the sensitivity of assembly 100 is improved compared to the prior art.

Recall that in the prior art, a housing was mounted around the image sensor and to the print circuit mother board. This housing supported a window above the image sensor. However, located between the window and the image sensor was air. Disadvantageously, air has a relatively low refractive index compared to the window. As those skilled in the art understand, as visible light or other electromagnetic radiation passes from a material having a high refractive index to a material having a low refractive index and vice versa, a significant percentage of the electromagnetic radiation is reflected. To illustrate, for a window having a refractive index of 1.52, at each window/air interface, approximately 4 percent of the electromagnetic radiation is reflected. Since the electromagnetic radiation had to pass from air, through the window, and back through air to reach the active area of the image sensor in the prior art, a significant percentage of the electromagnetic radiation was reflected. This resulted in an overall loss of sensitivity of prior art image sensor assemblies.

In contrast, window 110 and window support 108 of assembly 100 have a similar refractive index. Illustratively, the difference between the refractive index of window 110 and the refractive index of window support 108 is such that the amount of radiation reflected at the interface of window 110 and window support 108 is one percent or less. As an example, window 110 has a refractive index of 1.52 and window support 108 has a refractive index of 1.40. Accordingly, the amount of reflected radiation is reduced compared to the prior art. This improves the sensitivity of assembly 100 compared to prior art image sensor assemblies. In one embodiment, assembly 100 is 13% more sensitive to electromagnetic radiation than prior art image sensor assemblies.

Further, instead of having air between the window and the active area of the image sensor as in the prior art, window support 108 completely fills the region between window 110 and active area 104. In other words, assembly 100 is a cavityless package, i.e., assembly 100 does not have a cavity between window 110 and active area 104. Advantageously, by eliminating the prior art cavity between the active area and the window, the possibility of moisture condensation within the cavity is also eliminated. Accordingly, assembly 100 has no dew point.

In contrast, prior art image sensor assemblies had a dew point, i.e., a temperature at which condensation formed within the housing, which enclosed the image sensor and supported the window. In general, moisture had a tendency to condense within the housing and on the interior surface of the window. To avoid this condensation, it was important to avoid subjecting the image sensor assembly to extreme low temperatures. Disadvantageously, this limited the temperature range over which the image sensor assembly would satisfactorily perform. Alternatively, the image sensor assembly was fabricated in a low humidity environment to avoid trapping moisture within the housing and was hermetically sealed by the housing to keep out moisture. This added complexity, which increased the cost of the image sensor assembly. Further, in the event that the hermetic seal of the housing failed, the image sensor was damaged or destroyed.

Since assembly 100 does not have a dew point, assembly 100 operates satisfactorily over a broader range of temperatures and, more particularly, at lower temperatures than image sensor assemblies of the prior art. Further, since assembly 100 is a cavityless package, there is no possibility that moisture will leak into assembly 100. Accordingly, the reliability of assembly 100 is greater than that of the prior art.

Further, the housing of a prior art image sensor assembly was typically formed of ceramic, which was relatively expensive. Advantageously, assembly 100 in accordance with the present invention eliminates the need for a housing of the prior art. Accordingly, assembly 100 is significantly less expensive to manufacture than image sensor assemblies of the prior art.

Further, since window 110 is attached directly to image sensor 102 by window support 108, image sensor assembly 100 can be made relatively thin compared to a prior art image sensor assembly. To illustrate, a 0.039 inch (1.0 mm) or less thickness for image sensor assembly 100 is easily achievable.

In contrast, the prior art image sensor housing was relatively bulky and extended upwards from the printed circuit mother board a significant distance, e.g., 0.100 inches (2.54 mm) to 0.120 inches (3.05 mm) or more. Since assembly 100 can be made relatively thin, assembly 100 is well suited for use with miniature lightweight electronic devices, which require thin and lightweight image sensor assemblies.

A step up ring 120 surrounds active area 104. Step up ring 120 is ceramic, printed circuit board material, or electrically insulative tape, e.g., epoxy laminated tape, although other electrically insulative materials can be used.

A lower, e.g., first, surface 120L of step up ring 120 is attached directly to upper surface 102U of image sensor 102. More particularly, upper surface 102U of image sensor 102 includes a noncritical region NCR between active area 104 and bond pads 106. Step up ring 120 is mounted above noncritical region NCR and, in this embodiment, lower surface 120L of step up ring 120 is directly attached to noncritical region NCR, for example, with adhesive.

Electrically conductive traces 122 are formed on an upper, e.g., second, surface 120U of step up ring 120. Traces 122 are electrically connected to corresponding bond pads 106 by corresponding electrically conductive bond wires 124. Electrically conductive interconnection balls 126, e.g., solder, are formed on corresponding traces 122. Interconnection balls 126 are used to electrically connect assembly 100 to a larger substrate (not shown) such as a printed circuit mother board having an aperture aligned with window 110.

To illustrate, a first bond pad 106A of the plurality of bond pads 106 is electrically connected to a first trace 122A of the plurality of traces 122 by a first bond wire 124A of the plurality of bond wires 124. A first interconnection ball 126A of the plurality of interconnection balls 126 is formed on trace 122A. In this manner, interconnection ball 126A is electrically connected to bond pad 106A. The other bond pads 106, bond wires 124, traces 122, and interconnection balls 126 are electrically connected to one another in a similar fashion so are not discussed further to avoid detracting from the principals of the invention.

As set forth above, an electrically conductive pathway is formed between bond pads 106 and interconnection balls 126. However, in light of this disclosure, those of skill in the art will understand that other electrically conductive pathways can be formed. For example, contact metallizations can be interposed between the various electrical conductors, e.g., between bond pads 106 and bond wires 124, between bond wires 124 and traces 122, and/or between traces 122 and interconnection balls 126. As another alternative, traces 122 extends beyond sides 120S of step up ring 120 and are directly connected to bond pads 106 and bond wires 124 are not formed. As yet another alternative, interconnection balls 126 are distributed in an array format to form a ball grid array (BGA) type package. Alternatively, interconnection balls 126 are not formed, e.g., to form a metal land grid array (LGA) type package or a leadless chip carrier (LCC) package. Other electrically conductive pathway modifications will be obvious to those of skill in the art.

By forming interconnection balls 126 on traces 122 on upper surface 120U of step up ring 120, a interconnection balls 126 are elevated above exterior surface 110E of window 110.

Advantageously, use of step up ring 120 allows interconnection balls 126 to have minimum size and pitch. This may be important, for example, when a large number of interconnection balls 126 must be provided in a limited area.

Step up ring 120 includes a central aperture 128. Window 110 and window support 108 are located within, or are located adjacent to, central aperture 128 such that step up ring 120 is mounted around window 110 and window support 108. In one embodiment, window 110 and window support 108 are located within central aperture 128 and exterior surface 110E of window 110 is below upper surface 120U of step up ring 120. In an alternative embodiment, exterior surface 110E is coplanar with upper surface 120U. In yet another embodiment, exterior surface 110E is above upper surface 120U such that window 110 protrudes from central aperture 128. Generally, exterior surface 110E of window 110 is exposed through aperture 128.

Assembly 100 further includes an inner, e.g., first, package body 140. Inner package body 140 environmentally protects, e.g., from moisture, window 110, window support 108 and active area 104. In addition, inner package body 140 provides mechanical strength to assembly 100 and, in particular, minimizes failure of window 110, window support 108 and step up ring 120.

In this embodiment, inner package body 140 fills central aperture 128 of step up ring 120 and encloses window support 108 and upper surface 102U of image sensor 102 between step up ring 120 and window support 108. Generally, inner package body 140 fills between step up ring 120 and window support 108. Further, inner package body 140, in combination with window support 108, mechanically locks window 110 in place. In particular, inner package body 140 contacts sides 110S of window 110 thus locking window 110 in place. To enhance this locking of window 110, in one embodiment, sides 110S of window 110 include a locking feature such as that discussed in Webster et al., co-pending and commonly assigned U.S. patent application Ser. No. 09/490,717, entitled "PROTECTED IMAGE SENSOR PACKAGE", filed Jan. 25, 2000 and Webster et al., co-pending and commonly assigned U.S. patent application Ser. No. 09/491,112, entitled "PROTECTED IMAGE SENSOR PACKAGE FABRICATION METHOD", filed Jan. 25, 2000, which are both herein incorporated by reference in their entireties.

Inner package body 140 is formed of any one of a number of conventional packaging materials. For example, inner package body 140 is formed from a plastic encapsulant or, alternatively, a liquid encapsulant.

Assembly 100 further includes an outer, e.g., second, package body 150. Outer package body 150 electrically isolates and protects bond pads 106 and bond wires 124. In particular, outer package body 150 encloses sides 120S of step up ring 120, bond pads 106 and bond wires 124. In one embodiment, outer package body 150 also contacts a periphery of upper surface 120U of step up ring 120 adjacent sides 120S and encloses the ends of traces 122 thus enhancing the bond between bond wires 124 and traces 122.

Advantageously, assembly 100 is the size of image sensor 102, i.e., assembly 100 is chip size. Stated another way, outer package body 150 has outer sides 150S coplanar with sides 102S of image sensor 102. Since assembly 100 is chip size, assembly 100 is extremely well suited for use with miniature lightweight electronic devices, which require small and lightweight image sensor assemblies.

Figure 3:
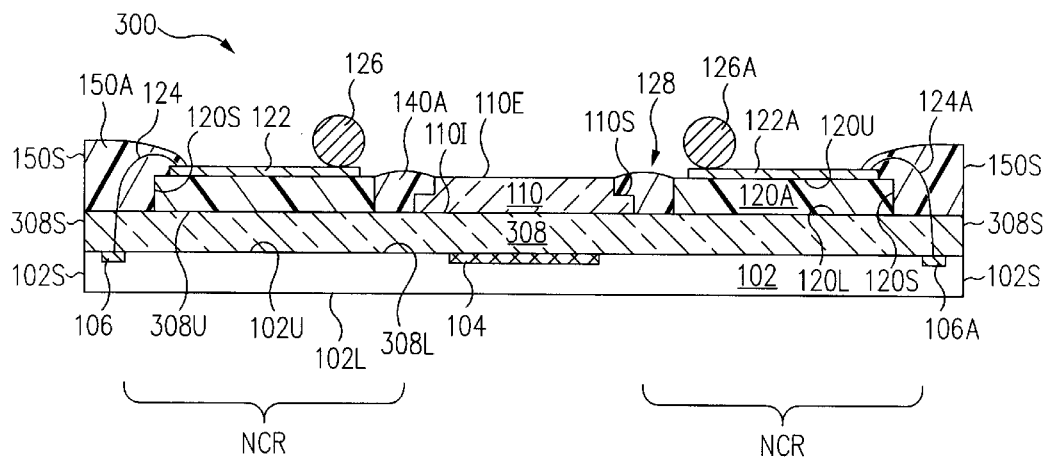
FIGS. 3, 4, 5 and 6 are cross-sectional views of image sensor assemblies in accordance with alternative embodiments of the present invention.

FIG. 3 is a cross-sectional view of an image sensor assembly 300 (hereinafter assembly 300) in accordance with an alternative embodiment of the present invention. Assembly 300 of FIG. 3 is similar to assembly 100 of FIG. 2 and only the significant differences are discussed below.

Referring now to FIG. 3, in this embodiment, formed on upper surface 102U of image sensor 102 is a window support 308. Window support 308 is transparent to the radiation of interest in a manner similar to that described above with regards to window support 108 of assembly 100 of FIG. 2. See also, Glenn et al., co-pending and commonly assigned U.S. patent application Ser. No. 09/610,314, entitled "WAFER SCALE IMAGE SENSOR PACKAGE", filed Jul. 5, 2000 and Glenn et al., co-pending and commonly assigned U.S. patent application Ser. No. 09/610,309, entitled "WAFER SCALE IMAGE SENSOR PACKAGE FABRICATION METHOD", filed Jul. 5, 2000, which are both herein incorporate by reference in their entireties.

Window support 308 entirely contacts and entirely encloses upper surface 102U including active area 104 and bond pads 106. More particularly, window support 308 has a lower, e.g., first, surface 308L in contact with upper surface 102U of image sensor 102. Window support 308 further has an upper, e.g., second, surface 308U, opposite lower surface 308L. Extending between upper surface 308U and lower surface 308L are sides 308S of window support 308. Sides 308S are coplanar with sides 102S of image sensor 102 and are also coplanar with sides 150S of an outer package body 150A.

Interior surface 110I of window 110 is secured to upper surface 308U of window support 308. Further, in accordance with this embodiment, lower surface 120L of a step up ring 120A is also secured to upper surface 308U of window support 308 such that step up ring 120A is mounted above noncritical region NCR of upper surface 102U of image sensor 102. Inner package body 140A fills the region between step up ring 120A and window 110 and, accordingly, contacts upper surface 308U of window support 308 between step up ring 120A and window 110.

As set forth above, window support 308 entirely encloses bond pads 106. Bond wires 124 pass through window support 308 to bond pads 106, e.g., bond wires 124 break through window support 308 to bond pads 106 from heat and mechanical energy during the wire-bonding process. Outer package body 150A is formed on upper surface 308U of window support 308 and encloses bond wires 124.

Figure 4:
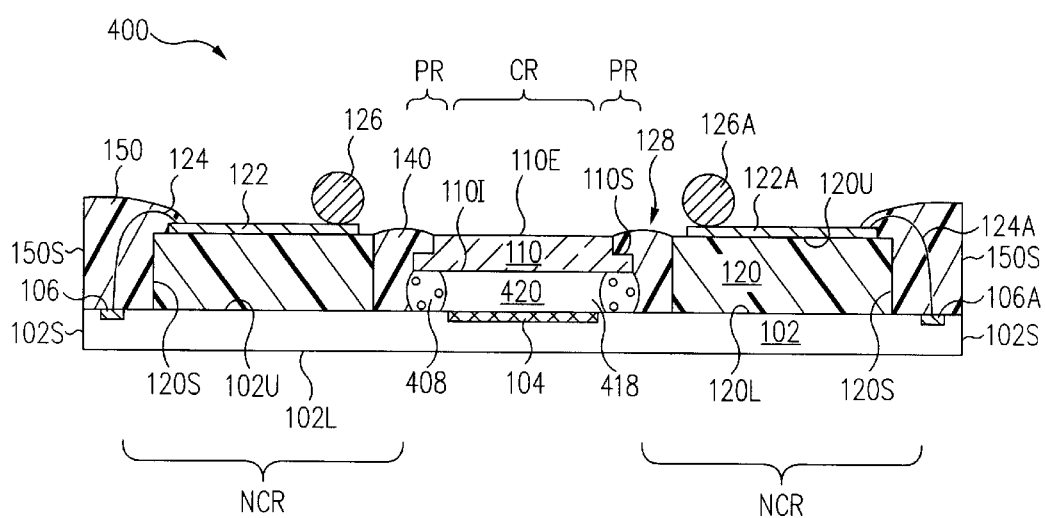

FIG. 4 is a cross-sectional view of an image sensor assembly 400 (hereinafter assembly 400) in accordance with an alternative embodiment of the present invention. Assembly 400 of FIG. 4 is similar to assembly 100 of FIG. 2 and only the significant differences are discussed below.

Referring now to FIG. 4, a window support 408 is formed on noncritical region NCR. More particularly, window support 408 is attached to, supported by, and contacts noncritical region NCR around active area 104 yet does not extend over active area 104. In this embodiment, window support 408 is an epoxy bead, e.g., a bead formed of a B-staged epoxy, which has been setup, i.e., cured, gelled, or made tacky. In one particular embodiment, window support 408 is Masterbond 150 manufactured by Masterbond, Inc. or Hysol 4451 manufactured by Dexter Corporation located in Industry, Calif.

Window support 408 contacts a peripheral region PR of interior surface 110I of window 110. Peripheral region PR of interior surface 110I is directly adjacent sides 110S and surrounds a central region CR of interior surface 110I. Window 110 and, more particularly, central region CR of interior surface 110I of window 110 overlies active area 104.

Window support 408 forms a seal between peripheral region PR of interior surface 110I of window 110 and noncritical region NCR of upper surface 102U of image sensor 102. Thus, window 110, window support 408, and image sensor 102 define a cavity 418, which is sealed. In particular, active area 104 is located within cavity 418, which is sealed to protect active area 104 against external moisture, dust and contamination. Generally, cavity 418 contains a medium 420, which is transparent to the radiation of interest. For example, medium 420 is air.

Advantageously, the volume of cavity 418 is relatively small. By minimizing the volume of cavity 418, the amount of any moisture trapped within cavity 418 is also minimized. This, in turn, essentially eliminates the possibility of moisture condensation on interior surface 110I of window 110 or active area 104 of image sensor 102. As a result, assembly 400 has a very low or nonexistent dew point.

In this embodiment, inner package body 140 fills central aperture 128 of step up ring 120 and encloses window support 408 and upper surface 102U of image sensor 102 between step up ring 120 and window support 408, in a manner similar to that described with regards to assembly 100 of FIG. 2.

Figure 5:
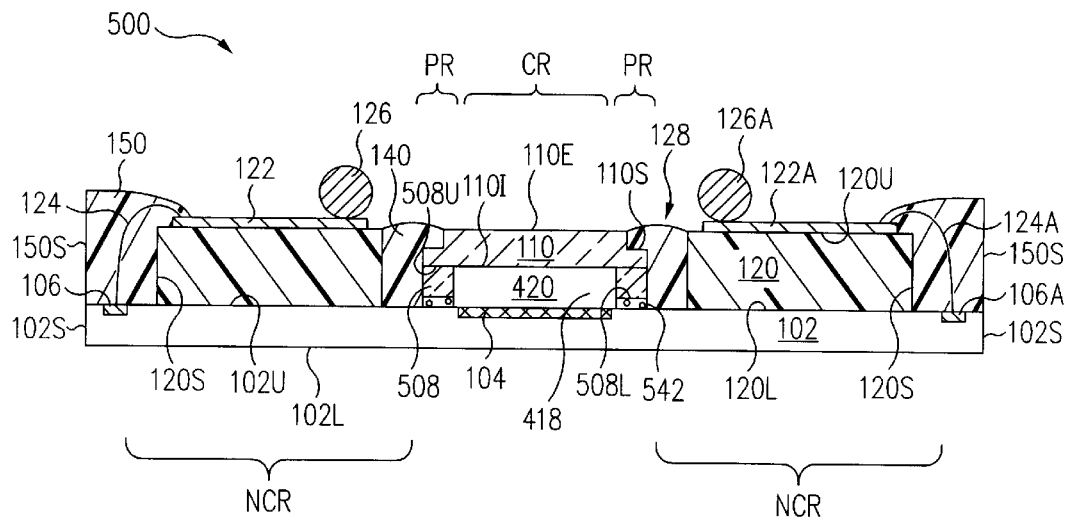

FIG. 5 is a cross-sectional view of image sensor assembly 500 (hereinafter assembly 500) in accordance with another alternative embodiment of the present invention. Assembly 500 of FIG. 5 is similar to assembly 400 of FIG. 4 and only the significant differences are discussed below.

Referring to FIG. 5, in this embodiment, a window support 508 is a rectangular, e.g., square, ring, i.e., is a rectangular block having a rectangular hole extending through the middle. An upper, e.g., first, surface 508U of window support 508 is attached to peripheral region PR of interior surface 110I of window 110, for example., with an epoxy adhesive or tape. Window 110 and window support 508 thus form an inverted cut shape enclosure.

In one embodiment, window support 508 is formed of the same material as the material of window 110, e.g., borosilicate glass. By forming window support 508 and window 110 of the same material, stress generated between window 110 and window support 508, e.g., due to differences in thermal expansion, are minimized or eliminated.

A lower, e.g., second, surface 508L of window support 508 is attached to noncritical region NCR of upper surface 102U of image sensor 102 around active area 104 by an adhesive layer 542. Illustratively, adhesive layer 542 is QMI 536 or QMI 550 manufactured by Quantum Materials located in San Diego, Calif.

Figure 6:
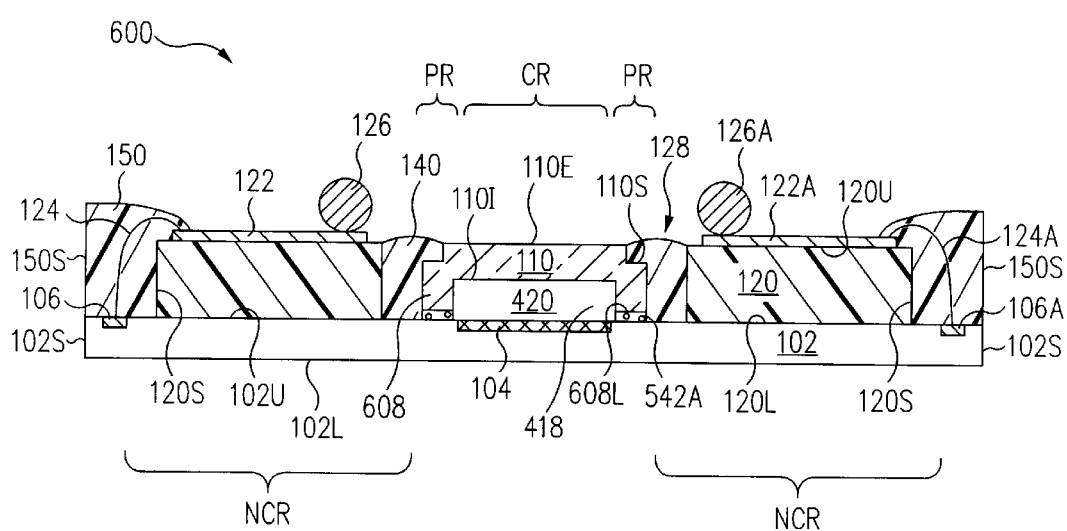

FIG. 6 as a cross-sectional view of an image sensor assembly 600 (hereinafter assembly 600) in accordance with yet another alternative embodiment of the present invention. Package 600 of FIG. 6 is similar to package 400 of FIG. 4 and only the significant differences are discussed below.

Referring to FIG. 6, window support 608 is a rectangular, e.g., square, ring. However, in this embodiment, window support 608 and window 110 are integral, i.e., are formed of a single piece and not of a plurality of separate pieces connected together. A lower, e.g., first, surface 608L of window support 608 is attached to noncritical region NCR of upper surface 102U of image sensor 102 around active area 104 by an adhesive layer 542A.

Illustratively, window support 608 and window 110 are formed from a single integral sheet, e.g., of borosilicate glass, using a method as described in Glenn et al., co-pending and commonly assigned U.S. patent application Ser. No. 09/577,692, entitled "IMAGE SENSOR PACKAGE HAVING SEALED CAVITY OVER ACTIVE AREA", filed May 22, 2000, and Glenn et al., co-pending and commonly assigned U.S. patent application Ser. No. 09/576,595 entitled "METHOD OF FORMING AN IMAGE SENSOR PACKAGE HAVING SEALED CAVITY OVER ACTIVE AREA", filed May 22, 2000, which are both herein incorporated by reference in their entireties.

Figure 7A:
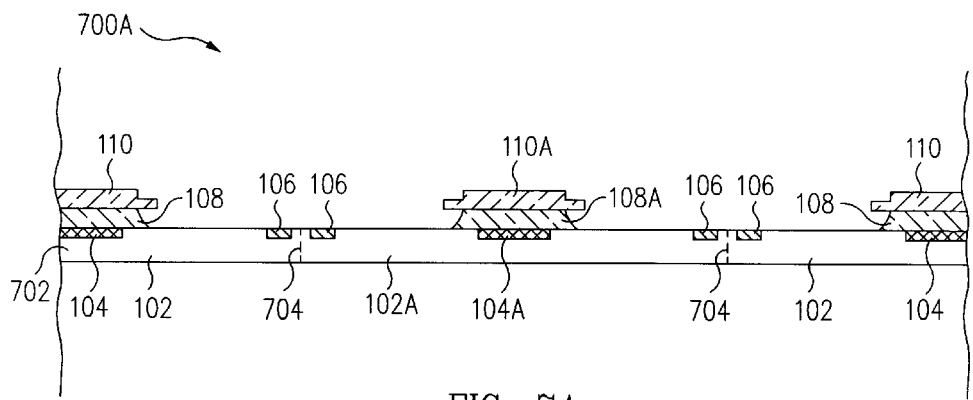
FIGS. 7A, 7B, 7C, 7D and 7E are cross-sectional views of structures during the fabrication of a plurality of image sensor assemblies in accordance with alternative embodiments of the present invention.

FIG. 7A is a cross-sectional view of a structure 700A during the fabrication of a plurality of assemblies 100 (FIGS. 1, 2) in accordance with one embodiment of the present invention. Structure 700A includes an image sensor substrate 702 such as a silicon wafer. Image sensor substrate 702 includes a plurality of image sensors 102 integrally connected together in an array format. Each of image sensors 102 are delineated by a singulation street 704, which is located between adjacent image sensors 102.

As shown in FIG. 7A, windows 110 are mounted above active areas 104 by window supports 108. For example, a first image sensor 102A of the plurality of image sensors 102 has a first active area 104A of the plurality of active areas 104. A first window 110A of the plurality of windows 110 is mounted above active area 104A by a first window support 108A of the plurality of window supports 108. The other windows 110 are similarly mounted above the other corresponding active areas 104 by the other corresponding window supports 108. Illustratively, structure 700A is fabricated as described in Webster et al., U.S. patent application Ser. No. 09/491,112, cited above.

Figure 7B:
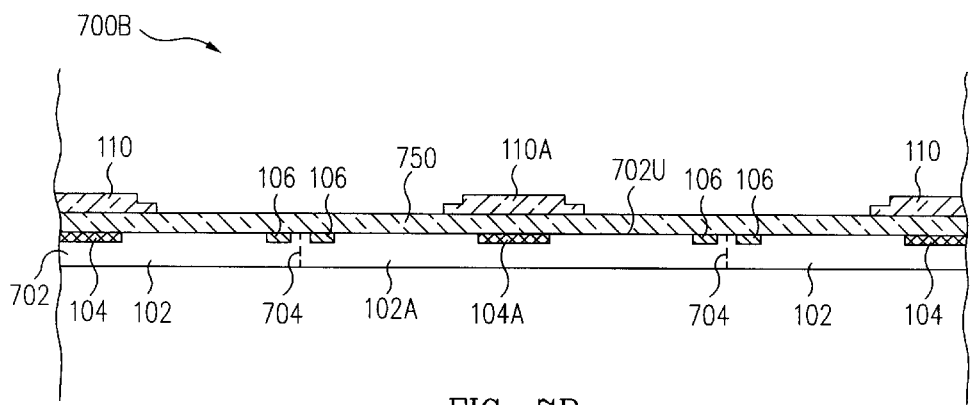

FIG. 7B is a cross-sectional view of a structure 700B during the fabrication of a plurality of assemblies 300 (FIG. 3) in accordance with an alternative embodiment of the present invention. Structure 700B of FIG. 7B is similar to structure 700A of FIG. 7A and only the significant differences are discussed below.

In accordance with this alternative embodiment, a single window support layer 750 is formed on an upper, e.g., first, surface 702U of image sensor substrate 702. Windows 110 are mounted above active areas 104 by window support layer 750, illustratively, as described in Glenn et al., U.S. patent application Ser. No. 09/610,309, cited above. For example, window 110A is mounted above active area 104A by window support layer 750.

Figure 7C:
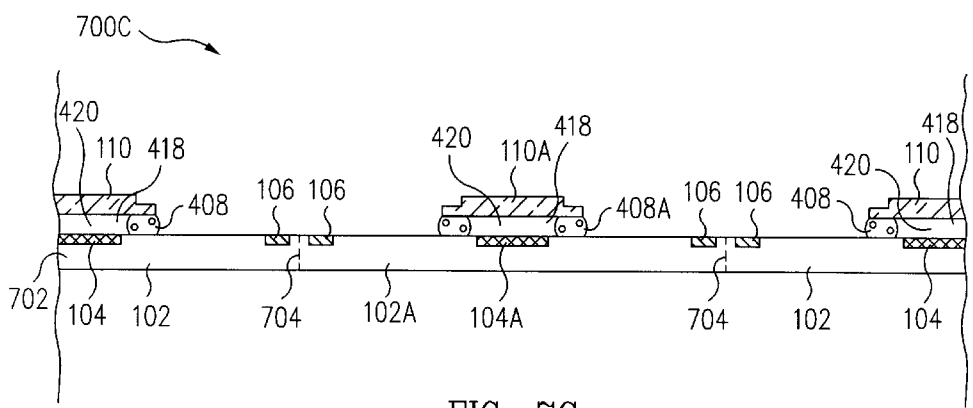
Figure 7D:
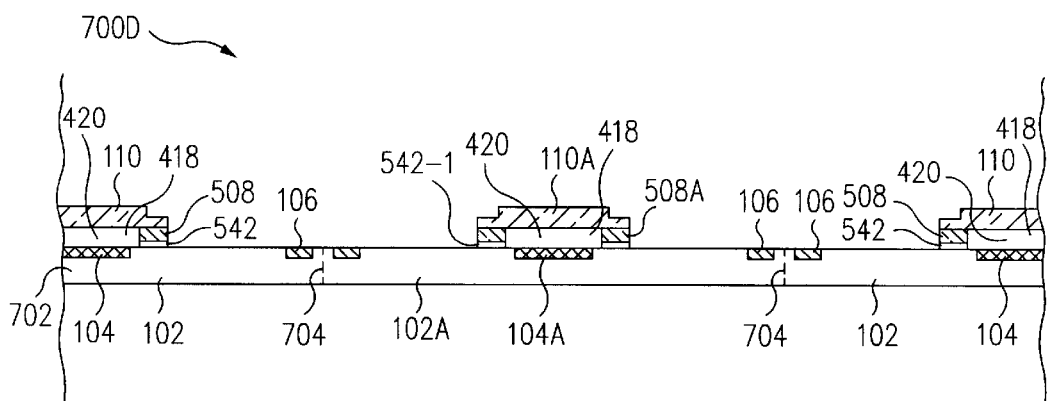
Figure 7E:
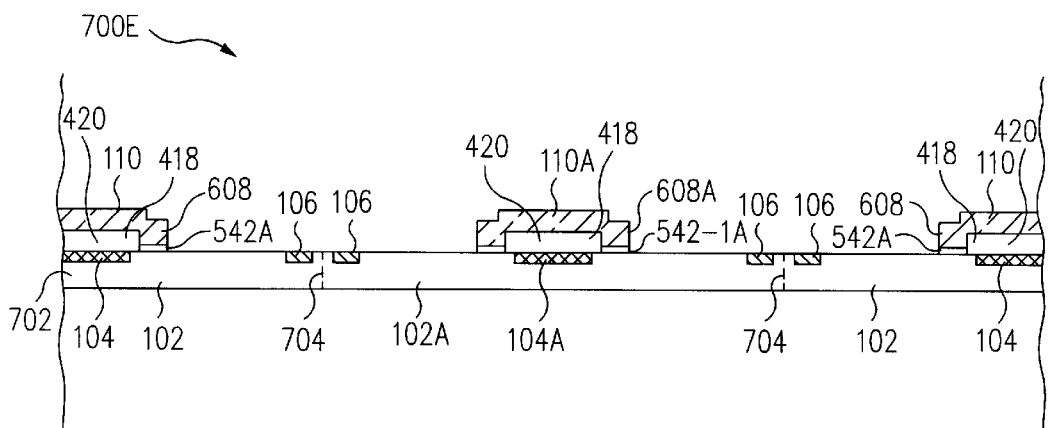

FIGS. 7C, 7D and 7E are cross-sectional views of structures 700C, 700D, 700E during the fabrication of a plurality of assemblies. 400, 500, 600 (FIGS. 4, 5, 6), respectively, in accordance with alternative embodiments of the present invention. Structures 700C, 700D, 700E of FIGS. 7C, 7D and 7E are similar to structure 700A of FIG. 7A and only the significant differences are discussed below.

Referring now to FIG. 7C, windows 110 are mounted above active areas 104 by window supports 408. To illustrate, window 110A is mounted above active area 104A by a first window support 408A of the plurality of window supports 408.

Referring now to FIGS. 7D, 7E, windows 110 are mounted above active areas 104 by window supports 508, 608 and adhesive layers 542, 542A, respectively. To illustrate, referring to FIG. 7D, window 110A is mounted above active area 104A by a first window support 508A of the plurality of window supports 508 and by a first adhesive layer 542-1 of the plurality of adhesive layers 542. Similarly, referring to FIG. 7E, window 110A is mounted above active area 104A by a first window support 608A of the plurality of window supports 608 and by a first adhesive layer 542-1A of the plurality of adhesive layers 542A. Illustratively, structures 700C, 700D, 700E are fabricated as described in Glenn et al., U.S. patent application Ser. No. 09/576,595, cited above.

Figure 8A:
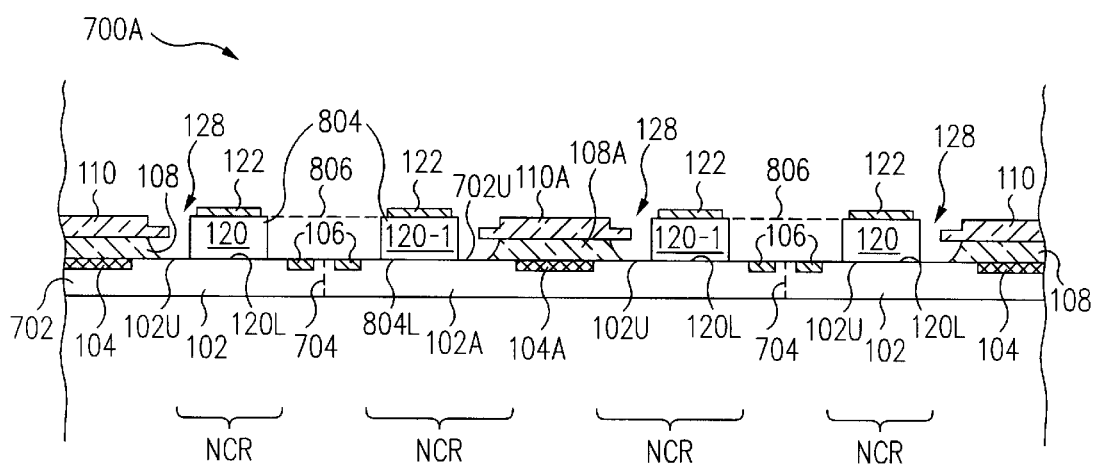
FIGS. 8A, 9, 10 and 11 are cross-sectional views of the structure of FIG. 7A at further stages of fabrication in accordance with the present invention.

FIG. 8A is a cross-sectional view of structure 700A of FIG. 7A at a further state of fabrication. Referring to FIG. 8A, step up rings 120 are mounted above upper surface 702U of image sensor substrate 702, for example with adhesive. Stated another way, lower surfaces 120L of step up rings 120 are mounted above noncritical regions NCR on upper surfaces 102U of image sensors 102. More particularly, lower surfaces 120L of step up rings 120 are mounted directly to noncritical regions NCR on upper surfaces 102U of image sensors 102. Step up rings 120 are mounted around window supports 108 and windows 110 such that window supports 108 and windows 110 are located in or adjacent central apertures 128 of step up rings 120.

To illustrate, a lower surface 120L of a first step ring 120-1 of the plurality of step up rings 120 is directly mounted to noncritical region NCR on upper surface 102U of image sensor 102A. Step up ring 120-1 is mounted around window 110A and window support 108A such that window support 108A and window 110A are located in or adjacent central aperture 128 of step up ring 120-1. The other step up rings 120 are mounted above the other corresponding noncritical regions NCR on upper surfaces 102U of image sensors 102 in a similar manner.

In one embodiment, step up rings 120 are individual pieces, which are mounted one at a time, i.e., sequentially. In another embodiment, step up rings 120 are individual pieces, which are all mounted at the same time, i.e., simultaneously.

In yet another embodiment, a single sheet 804, e.g., of epoxy laminated tape, includes a plurality of step up rings 120 integrally connected to one another, for example, with bridge portions 806 (indicated in dashed lines). In accordance with this embodiment, a lower, e.g., first, surface 804L of sheet 804 is mounted to upper surface 702U of image sensor substrate 702, thus mounting step up rings 120 above noncritical regions NCR of image sensors 102 and around window supports 108 and windows 110.

In FIG. 8A, mounting of step up rings 120 around windows 110 and window supports 108 is illustrated. However, in accordance with the alternative embodiment illustrated in FIG. 7C, step up rings 120 are mounted around windows 110 and window supports 408 in a similar manner. Further, in accordance with the alternative embodiments illustrated in FIGS. 7D, 7E, step up rings 120 are mounted around windows 110, window supports 508, 608 and adhesive layers 542, 542A, respectively, in a similar manner.

Figure 8B:
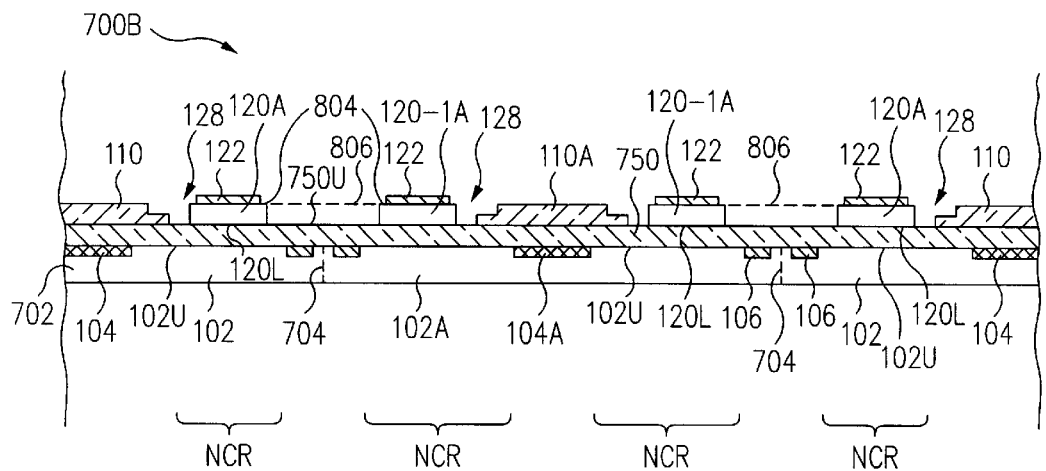
FIG. 8B is a cross-sectional view of the structure of FIG. 7B at a further stage of fabrication in accordance with one embodiment of the present invention.

FIG. 8B is a cross-sectional view of structure 700B of FIG. 7B at a further state of fabrication. Lower surfaces 120L of step up rings 120A are mounted above noncritical regions NCR on upper surfaces 102U of image sensors 102, for example with adhesive. More particularly, lower surfaces 120L of step up rings 120A are mounted directly to an upper surface 750U of window support layer 750 above noncritical regions NCR. Step up rings 120A are mounted around windows 110 such that windows 110 are located in or adjacent central apertures 128 of step up rings 120A.

To illustrate, a lower surface 120L of a first step up ring 120-1A of the plurality of step up rings 120A is mounted directly to upper surface 750U of window support layer 750 above noncritical region NCR on upper surface 102U of image sensor 102A. Step up ring 120-1A is mounted around window 110A such that window 110A is located in or adjacent central aperture 128 of step up ring 120-1A. The other step up rings 120A are mounted above the other corresponding noncritical regions NCR on upper surfaces 102U of image sensors 102 in a similar manner.

Figure 9:
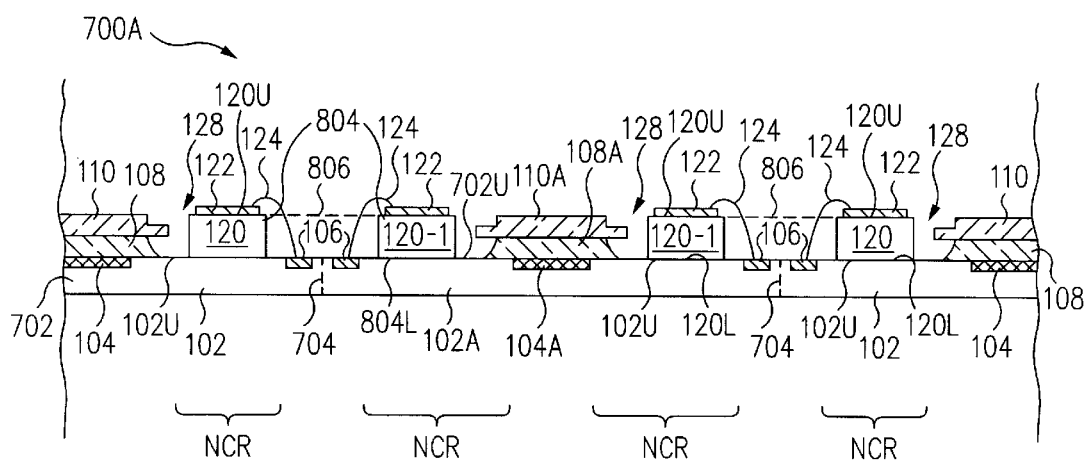
Figure 10:
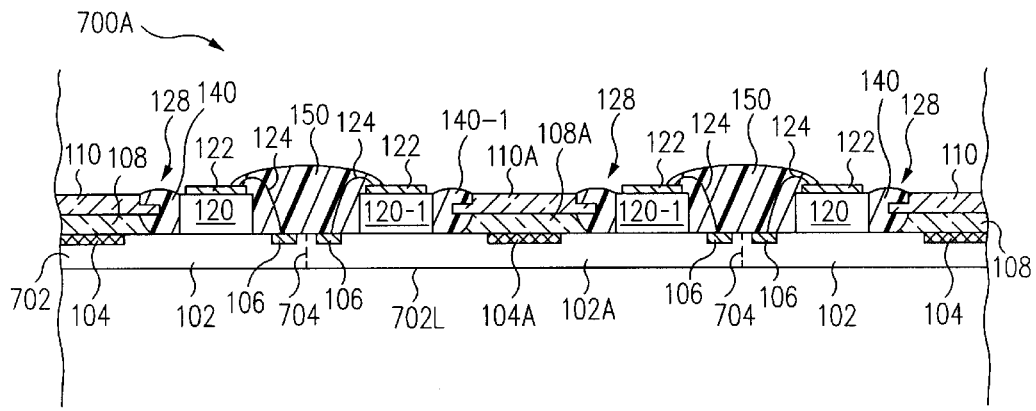
Figure 11:
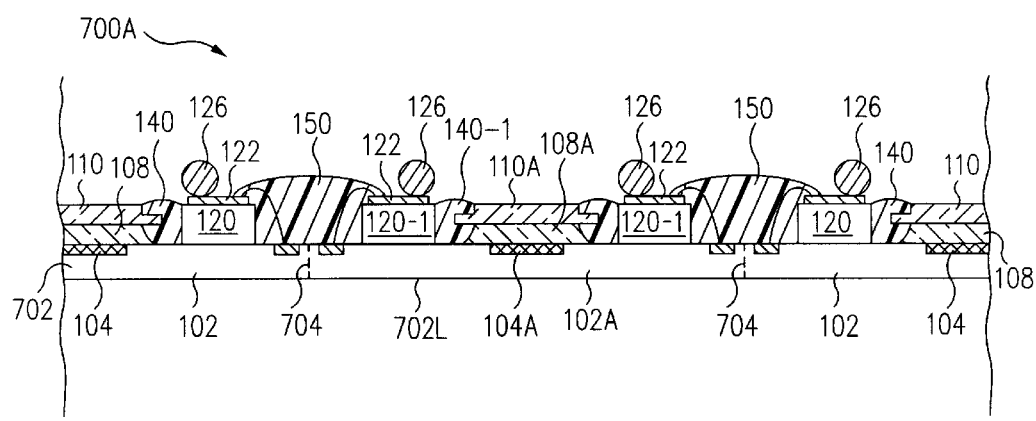

FIGS. 9, 10, and 11 illustrate the fabrication of a plurality of assemblies 100 (FIGS. 1, 2). However, it is understood that a plurality of assemblies 300, 400, 500, 600 (FIGS. 3, 4, 5, 6, respectively) are fabricated in a similar manner as that illustrated in FIGS. 9, 10, and 11 and so fabrication of assemblies 300, 400, 500, 600 is not discussed further to avoid attracting from the principals of the invention.

FIG. 9 is a cross-sectional view of structure 700A of FIG. 8A at a further stage of fabrication. Referring to FIG. 9, traces 122 on upper surfaces 120U of step up rings 120 are electrically connected to bond pads 106 of image sensors 102 by bond wires 124.

FIG. 10 is a cross-sectional view of structure 700A of FIG. 9 at a further stage of fabrication. Referring to FIG. 10, inner package bodies 140 are formed. To illustrate, a first inner package body 140-1 of the plurality of inner package bodies 140 is formed by encapsulant filling between step up ring 120-1 and window support 108A/window 110A. More generally, central aperture 128 of step up ring 120-1 is filled with encapsulant to form inner package body 140-1. For example, central aperture 128 is filled with a liquid encapsulant, which is cured to form inner package body 140-1. Alternatively, central aperture 128 is filled with a plastic encapsulant to form inner package body 140-1. The other inner package bodies 140 are formed in a similar manner simultaneously, or alternatively, sequentially.

Referring still to FIG. 10, outer package bodies 150 are formed. Outer package bodies 150 are formed by encapsulant filling between step up rings 120. For example, the regions between step up rings 120 are filled with a liquid encapsulant, which is cured to form outer package bodies 150. Alternatively, the regions between step up rings 120 are filled with a plastic encapsulant to form outer package bodies 150.

After formation of package bodies 150, in one embodiment, a lower, e.g., second surface 702L of image sensor substrate 702 is back lapped, i.e., ground down. Back lapping lower surface 702L reduces the thickness of image sensor substrate 702 and, correspondingly, results in a minimum thickness for assembly 100 (FIG. 2).

FIG. 11 is a cross-sectional view of structure 700A of FIG. 10 at a further stage of fabrication. Referring now to FIG. 11, interconnection balls 126 are formed on traces 122. In one embodiment, after formation of interconnection balls 126, each assembly 100 is tested for validity, i.e., to determine whether the assembly 100 is defective or not. Advantageously, testing each assembly 100 while still in wafer form, i.e., before singulation of image sensor substrate 702, is less labor intensive and less complex than testing each assembly 100 individually.

After formation of interconnection balls 126 and, optionally, validity testing assemblies 100, image sensor substrate 702 is singulated along singulation streets 704 resulting in a plurality of assemblies 100 (FIGS. 1, 2). Alternatively, interconnection balls 126 are formed on traces 122 after image sensor substrate 702 is singulated. Although the formation of a plurality of assemblies 100 simultaneously is described above, it is understood that assemblies 100 can be fabricated on an individual basis, if desired.

Figure 12:
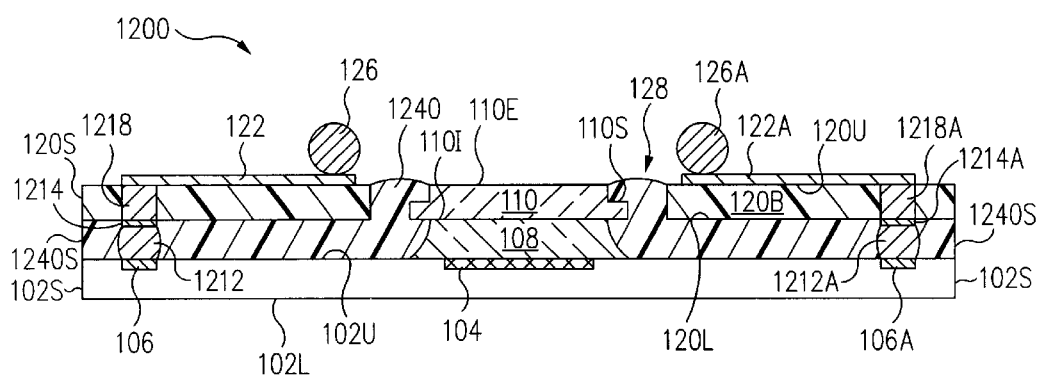
FIG. 12 is a cross-sectional view of an image sensor assembly in accordance with an alternative embodiment of the present invention.

FIG. 12 is a cross-sectional view of an image sensor assembly 1200 (hereinafter assembly 1200) in accordance with an alternative embodiment of the present invention. Assembly 1200 of FIG. 12 is similar to assembly 100 of FIG. 2 and only the significant differences are discussed below.

Referring now to FIG. 12, a step up ring 120B is flip chip mounted to image sensor 102. More particularly, formed on lower surface 120L of step up ring 120B are a plurality of electrically conductive interior, e.g., first, traces 1214, which include a first interior trace 1214A. Bond pads 106 are if; electrically connected to corresponding interior traces 1214 by corresponding electrically conductive bumps 1212, sometimes called flip chip bumps 1212. Illustratively, bumps 1212 are: (1) stud bumps, i.e., gold balls; (2) electrically conductive epoxy paste; (3) electrically conductive epoxy film; or (4) solder. Generally, step up ring 120B is mounted to image sensor 102 by bumps 1212.

Traces 122, sometimes called exterior or second traces 122, on upper surface 120U of step up ring 120B are electrically connected to corresponding interior traces 1214 by corresponding electrically conductive vias 1218. Vias 1218 extend through step up ring 120B from lower surface 120L to upper surface 120U.

To illustrate, bond pad 106A is electrically and physically connected to interior trace 1214A by a first bump 1212A of the plurality of bumps 1212. Interior trace 1214A is electrically connected to trace 122A by a first via 1218A of the plurality of vias 1218. Formed on trace 122A is interconnection ball 126A.

Advantageously, step up ring 120B is readily flip chip mounted to image sensor 102, which can have a wide variety of arrangements of bond pads 106. Illustratively, bond pads 106 are arranged in rows adjacent sides 102S of image sensor 102 (see FIG. 1, for example). Alternatively, bond pads 106 are distributed, e.g., in an array, on upper surface 102U of image sensor 102.

Referring still to FIG. 12, a package body 1240 fills central aperture 128 of step up ring 120B and encloses window support 108. Package body 1240 is formed of any one of a number of underfill materials commonly used in flip chip processing.

In this embodiment, due to the flip chip mounting of step up ring 120B, a space exists between lower surface 120L of step up ring 120B and upper surface 102U of image sensor 102. Package body 1240 fills this space between lower surface 120L of step up ring 120B and upper surface 102U of image sensor 102. Package body 1240 extends to sides 102S of image sensor 102 such that sides 120S of step up ring 120B, sides 1240S of package body 1240 and sides 102S of image sensor 102 are coplanar.

As shown in FIG. 12, package body 1240 also encloses bumps 1212. Package body 1240 enhances the reliability of assembly 1200 by preventing the failure of bumps 1212 and preventing the associated dismounting of step up ring 120B. For example, package body 1240 insures that step up ring 120B does not become dismounted from image sensor 102 as a result of any differential thermal extension between step up ring 120B and image sensor 102.

In FIG. 12, window 110 is mounted to image sensor 102 by window support 108. However, in alternative embodiments, instead of using window support 108 to mount window 110, window support 308, 408, 508, or 608 of FIGS. 3, 4, 5, or 6, respectively, is used to mount window 110 to image sensor 102.

Figure 13:
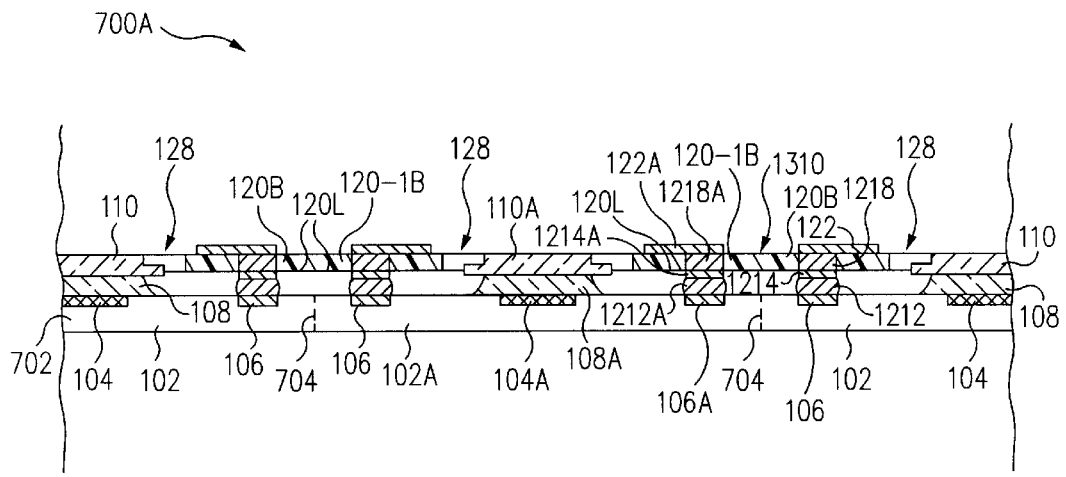
FIG. 13 is a cross-sectional view of the structure of FIG. 7A at a further stage of fabrication in accordance with another embodiment of the present invention.

FIG. 13 is a cross-sectional view of structure 700A of FIG. 7A at a later stage during fabrication of a plurality of assemblies 1200 (FIG. 12) in accordance with one embodiment of the present invention. A single sheet 1310 comprises a plurality of step up rings 120B integrally connected together. Sheet 1310 is mounted to image sensor substrate 702 by bumps 1212.

To form bumps 1212 and thus mount sheet 1310, sheet 1310 is aligned with image sensor substrate 702 using any one of a number of alignment techniques, e.g., sheet 1310 is optically or mechanically aligned. More particularly, interior traces 1214 on lower surfaces 120L of step up rings 120B are aligned with corresponding bond pads 106. Bumps 1212 are formed between interior traces 1214 and bond pads 106 thus mounting sheet 1310 to image sensor substrate 702 and, more specifically, mounting step up rings 120B to corresponding image sensors 102.

To illustrate, a first interior trace 1214A is formed on lower surface 120L of a first step up ring 120-1B of the plurality of step up rings 120B. Interior trace 1214A is aligned with bond pad 106A. Bump 1212A is formed between interior trace 1214A and bond pad 106A. Bump 1212A physically and electrically connects interior trace 1214A to bond pad 106A thus flip chip mounting step up ring 120-1B to image sensor 102A. The other step up ring 120B are flip chip mounted to the other image sensors 102 in a similar manner.

Bumps 1212 are formed using any one of a number of techniques. For example, solder bumps are formed on bond pads 106 of image sensors 102 or on interior traces 1214, and these solder bumps are reflowed to form bumps 1212. Alternatively, bumps 1212 are formed by applying an electrically conductive epoxy paste or film to bond pads 106 or interior traces 1214 and thermally or optically curing this electrically conductive epoxy paste or film. As a further alternative, bumps 1212 are formed by thermal or thermosonic bonding of gold bumps formed on bond pads 106 or on interior traces 1214. In light of this disclosure, those of skill in the art will understand that other methods of attaching sheet 1310 to image sensor substrate 702 can be used.

Advantageously, bumps 1212 are formed simultaneously reducing labor and increasing efficiency compared to wire-bonding each bond pad 106 sequentially. In this manner, the cost of fabricating assembly 1200 (FIG. 12) is minimized.

Figure 14:
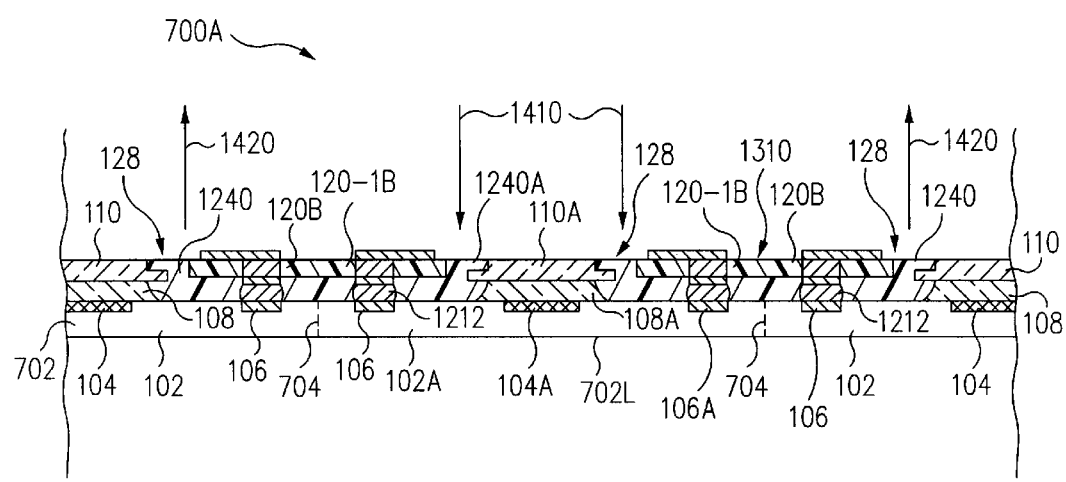
FIG. 14 is a cross-sectional view of the structure of FIG. 13 at a further state of fabrication.

FIG. 14 is a cross-sectional view of structure 700A of FIG. 13 at a further stage of fabrication. As shown in FIG. 14, package bodies 1240 are formed to enclose window supports 108, bumps 1212 and generally to fill the space between sheet 1310 and image sensor substrate 702. To illustrate, a first package body 1240A of the plurality of package bodies 1240 is formed by underfilling between step up ring 120-1B and image sensor 102A and around window support 108A/window 110A.

To avoid trapping air underneath sheet 1310, in one embodiment, an underfill material is applied into a central aperture 128 of a first step up ring 120B of sheet 1310 and allowed to flow between sheet 1310 and image sensor substrate 702 to the adjacent central apertures 128 of the adjacent step up rings 120B of sheet 1310. This allows the air in the space between sheet 1310 and image sensor substrate 702 to be displaced, instead of trapped, by the underfill material.

To illustrate, underfill material is applied into a central aperture 128 of step up ring 120-1B around window 110A and window support 108A as indicated by arrows 1410. This underfill material flows from central aperture 128 of step up ring 120-1B between sheet 1310 and image sensor substrate 702 to central apertures 128 of the adjacent step up rings 120B. As this underfill material flows, air is displaced and escapes through central apertures 128 of the adjacent step up rings 120B as indicated by arrows 1420. The underfill material is then cured, if necessary, to form package bodies 1240.

After formation of package bodies 1240, in one embodiment, image sensor substrate 702 is back lapped, i.e., lower surface 702L is ground down. Each assembly 1200 is tested for validity. Image sensor substrate 702 is singulated along singulation streets 704. Alternatively, interconnection balls 126 are formed on corresponding traces 122 in a manner similar to that illustrated in FIG. 11, and, after formation of interconnection balls 126, image sensor substrate 702 is singulated. In either embodiment, sheet 1310 is singulated into step up rings 120B during singulation of image sensor substrate 702. However, in an alternative embodiment, instead of mounting a single sheet 1310 comprising a plurality of step up rings 120B integrally connected together, step up rings 120B are mounted individually as individual pieces sequentially or simultaneously to image sensor substrate 702.

In FIGS. 13 and 14, windows 110 are mounted to image sensors 102 by window supports 108. However, in alternative embodiments, instead of using window supports 108 to mount windows 110, window supports 308, 408, 508, or 608 of FIGS. 3, 4, 5, or 6, respectively, are used to mount windows 110 to image sensors 102.

This application is related to Glenn et al., co-filed and commonly assigned U.S. patent application Ser. No. 09/711,993, entitled "CHIP SIZE IMAGE SENSOR WIREBOND PACKAGE"; Glenn et al., co-filed and commonly assigned U.S. patent application Ser. No. 09/712,313, entitled "CHIP SIZE IMAGE SENSOR BUMPED PACKAGE"; and Glenn et al., co-filed and commonly assigned U.S. patent application Ser. No. 09/711,994, entitled "CHIP SIZE IMAGE SENSOR BUMPED PACKAGE FABRICATION METHOD", which are all herein incorporated by reference in their entireties.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

We claim:

1. A method comprising:

mounting a window above an active area on a first surface of a sensor device, said sensor device comprising a bond pad on said first surface, wherein said sensor device is one of a plurality of sensor devices integrally connected together in a wafer;

mounting a step up ring above a noncritical region said first surface between said bond pad and said active area, wherein said step up ring is one of plurality of step up rings integrally connected together in a sheet, said method further comprising mounting a first surface of said sheet to a first surface of said wafer; and electrically connecting a trace on said step up ring to said bond pad.

2. The method of claim 1 further comprising singulating said wafer.

3. A method comprising:

mounting a window above an active area on a first surface of a sensor device, said sensor device comprising a bond pad on said first surface;

mounting a step up ring above a noncritical region of said first surface between said bond pad and said active area, wherein said step up ring comprises a central aperture;

electrically connecting a trace on said step up ring to said bond pad; and filling said central aperture with an encapsulant to form a package body.

4. The method of claim 3 wherein said mounting a step up ring comprises directly mounting a first surface of said step up ring to said noncritical region.

5. The method of claim 3 wherein said step up ring is mounted around said window.

6. The method of claim 5 wherein said window is located in or adjacent said central aperture.

7. The method of claim 3 wherein said sensor device is one of a plurality of sensor devices integrally connected together in a wafer.

8. The method of claim 3 wherein said mounting a step up ring comprises mounting a first surface of said step up ring to a window support layer above said noncritical region.

9. The method of claim 8 wherein said window is mounted above said active area by said window support layer.

10. The method of claim 3 wherein said window is mounted above said active area by a window support.

11. The method of claim 3 wherein said electrically connecting a trace on said step up ring to said bond pad comprises wire bonding said trace to said bond pad with a bond wire.

12. The method of claim 11 wherein said package body is a first package body, said method further comprising forming a second package body to enclose said bond wire.

13. The method of claim 3 wherein said mounting a step up ring above a noncritical region comprises mounting said step up ring around said window such that said window is located in or adjacent said central aperture.

14. The method of claim 3 wherein said sensor device is an image sensor.

15. The method of claim 14 wherein said active area is responsive to radiation.

16. A method comprising:

mounting a window above an active area on a first surface of a sensor device;

directly attaching a first surface of a step up ring to said first surface of said sensor device, said step up ring being mounted around said window; and electrically connecting said bond pad to an electrically conductive trace on a second surface of said step up ring, wherein said sensor device comprises a bond pad on said first surface of said sensor device, a noncritical region of said first surface of said sensor device being between said active area and said bond pad, said directly attaching comprises directly attaching said first surface of said step up ring to said noncritical region.

17. The method of claim 16 wherein said directly attaching comprises directly attaching said first surface of said step up ring to said first surface of said sensor device with adhesive.

18. The method of claim 16 wherein said electrically connecting comprises forming a bond wire between said bond pad and said trace.

19. The method of claim 16 further comprising forming an interconnection ball on said trace.

20. The method of claim 16 wherein said sensor device is one of a plurality of sensor devices integrally connected together in a wafer.

21. The method of claim 20 further comprising singulating said wafer.

22. A method comprising:

mounting a window above an active area on a first surface of a sensor device, wherein said sensor device is one of a plurality of sensor devices integrally connected together in a wafer; and directly attaching a first surface of a step up ring to said first surface of said sensor device, said step up ring being mounted around said window, wherein said step up ring is one of plurality of step up rings integrally connected together in a sheet; and mounting a first surface of said sheet to a first surface of said wafer.

23. The method of claim 22 wherein said sensor device comprises a bond pad on said first surface of said sensor device, a noncritical region of said first surface of said sensor device being between said active area and said bond pad, said directly attaching comprises directly attaching said first surface of said step up ring to said noncritical region.

24. A method comprising:

mounting a window above an active area of an image sensor by a single window support layer having a first surface in contact with a first surface of an image sensor substrate comprising said image sensor; and directly attaching a first surface of a step up ring to a second surface of said window support layer, said step up ring being mounted around said window.

25. The method of claim 24 wherein said image sensor comprises a first surface, said active area and a bond pad of said image sensor being on said first surface of said image sensor, a noncritical region of said first surface of said image sensor being between said active area and said bond pad, said step up ring being mounted above said noncritical region.

26. The method of claim 25 further comprising electrically connecting said bond pad to an electrically conductive trace on a second surface of said step up ring.

27. The method of claim 24 further comprising singulating said image sensor substrate.

* * * * *